(12) United States Patent
Iwamoto et al.

(10) Patent No.: US 8,374,304 B2
(45) Date of Patent: Feb. 12, 2013

(54) FILTER CIRCUIT FOR REMOVING NOISE PULSES FROM DIGITAL INPUT SIGNAL

(75) Inventors: Reiji Iwamoto, Nagoya (JP); Satoshi Ohi, Osaka (JP)

(73) Assignee: DENSO CORPORATION, Kariya (JP)

( * ) Notice: Subject to any disclaimer, the term of this patent is extended or adjusted under 35 U.S.C. 154(b) by 1423 days.

(21) Appl. No.: 12/010,218

(22) Filed: Jan. 22, 2008

(65) Prior Publication Data

US 2008/0174338 A1 Jul. 24, 2008

(30) Foreign Application Priority Data

Jan. 24, 2007 (JP) ................................ 2007-013723

(51) Int. Cl.
*H04L 7/00* (2006.01)
(52) U.S. Cl. ........................................ 375/355; 375/354
(58) Field of Classification Search .................. 375/354, 375/355
See application file for complete search history.

(56) References Cited

U.S. PATENT DOCUMENTS

| | | | | |
|---|---|---|---|---|
| 3,767,939 A * | 10/1973 | Chamran et al. | ............... | 327/553 |
| 3,990,015 A * | 11/1976 | Gordy et al. | ................... | 329/304 |
| 4,066,919 A * | 1/1978 | Huntington | ...................... | 327/94 |
| 4,370,571 A * | 1/1983 | Andow et al. | .................... | 327/92 |
| 4,549,166 A * | 10/1985 | Hotta et al. | ................... | 341/144 |
| 5,736,953 A * | 4/1998 | Yamaguchi | .................... | 341/163 |
| 5,978,124 A * | 11/1999 | Maekawa et al. | ............. | 398/197 |
| 6,255,875 B1 * | 7/2001 | Gabara | ......................... | 327/201 |
| 6,340,903 B1 * | 1/2002 | Leith | ............................... | 327/94 |
| 7,656,335 B2 * | 2/2010 | Bauer et al. | .................... | 341/155 |
| 7,719,350 B1 * | 5/2010 | Luh | ............................... | 327/557 |
| 8,035,542 B2 * | 10/2011 | Ishikawa | ....................... | 341/144 |
| 2003/0234641 A1 * | 12/2003 | Bottomley et al. | ........ | 324/76.42 |
| 2004/0002313 A1 * | 1/2004 | Peace et al. | ................. | 455/234.1 |
| 2004/0059517 A1 * | 3/2004 | Szajnowski | ..................... | 702/18 |
| 2005/0035791 A1 * | 2/2005 | Devendorf et al. | ............. | 327/94 |
| 2005/0068211 A1 * | 3/2005 | Arai et al. | ...................... | 341/138 |
| 2006/0273945 A1 * | 12/2006 | Bauer et al. | ................... | 341/155 |

FOREIGN PATENT DOCUMENTS

| JP | A-63-306723 | 12/1988 |
|---|---|---|
| JP | A-10-299406 | 11/1998 |
| JP | A-2000-134070 | 5/2000 |

OTHER PUBLICATIONS

Office Action mailed on Jun. 7, 2011 in corresponding JP application No. 2007-013723 (and English translation).

* cited by examiner

*Primary Examiner* — Erin File
(74) *Attorney, Agent, or Firm* — Posz Law Group, PLC

(57) ABSTRACT

A filter circuit includes an input-signal processing section and a signal-level determining section. The input-signal processing section samples and holds a digital input signal input according to a clock signal, outputs the holding signal as a sampling input signal when a level of the digital input signal is constant between sampling points, and reverses the holding signal and outputs the reversed signal as the sampling input signal when the level of the digital input signal changes between the sampling points. The signal-level determining section sequentially delays the sampling input signal from the input-signal processing section into plural stages, outputs a first level signal at a first level when all the delayed signals are at the first level, and outputs a second level signal at a second level when all the delayed signals are at the second level.

8 Claims, 12 Drawing Sheets

US 8,374,304 B2

FILTER CIRCUIT FOR REMOVING NOISE PULSES FROM DIGITAL INPUT SIGNAL

CROSS REFERENCE TO RELATED APPLICATION

The present application is based on and claims priority to Japanese Patent Application No. 2007-13723 filed on Jan. 24, 2007, the contents of which are incorporated in their entirety herein by reference.

BACKGROUND OF THE INVENTION

1. Field of the Invention

The present invention relates to a filter circuit for removing noise in a digital signal and, more specifically, for removing noise pulses of various widths from a digital input signal.

2. Description of the Related Art

For example as described in JP-2000-134070A, a noise reduction circuit removes noise from a series of digital signals by sampling signals input through a signal line. Because noise is mixed with a digital input signal as a pulse signal having a short width, the noise reduction circuit samples the input signal in accordance with a clock signal and removes any pulse signals having a width shorter than a predetermined width.

Specifically, the noise reduction circuit includes a plurality of delay devices for delaying the digital signal sequentially, a first logic circuit that generates a first determining signal when outputs of all the delay devices are at a logical high (H) level, a second logic circuit that generates a second determining signal when outputs of all the delay devices are at a logical low (L) level, and a reset-set (RS) flip-flop circuit that outputs a signal at the H level when the first determining signal is input and outputs a signal at the L level when the second determining signal is input.

The noise reduction circuit removes noise based only on a signal level at a sampling point. Thus, when noise signals each having a different level from an input signal and a width shorter than a sampling cycle are successively mixed with the input signal having a constant level at successive sampling points, the noise reduction circuit successively samples the different level over a predetermined number of times. As a result, the output of the RS flip-flop circuit is reversed and the noise signals are output as normal signals.

SUMMARY OF THE INVENTION

It is an object of the present invention to provide a filter circuit and/or a signal processing circuit that can remove noise signals even when the noise signals are mixed with the input signal at successive sampling points.

According to a first aspect of the invention, a filter circuit includes an input-signal processing section and a signal-level determining section. The input-signal processing section samples and holds a digital input signal input according to a clock signal, outputs the holding signal as a sampling input signal when a level of the digital input signal is constant between sampling points, and reverses the holding signal and outputs the reversed signal as the sampling input signal when the level of the digital input signal changes between the sampling points. The signal-level determining section sequentially delays the sampling input signal from the input-signal processing section into plural stages, outputs a first level signal at a first level when all the delayed signals are at the first level, and outputs a second level signal at a second level when all the delayed signals are at the second level.

According to a second aspect of the invention, a filter circuit includes an input-signal processing section and a signal-level determining section. The input-signal processing section is configured to output a sample of a digital input signal at a first sampled level, and the digital input signal is sampled according to a clock signal. The sample is output at the first sampled level when a level of the digital input signal is constant between the sampling points, and is output the sample at a reversed sample level when the level of the digital input signal changes between the sampling points. The signal-level determining section outputs a sample signal at a first level when all of one or more delayed versions of the sample are at the first level, and outputs a signal at a second level when all of the one or more delayed versions of the sample are at the second level.

According to a third aspect of the invention, a signal processing circuit for implementing a digital filter, includes a digital sample-and-hold section and a level determining section. The digital sample-and-hold section is configured to perform a sample-and-hold operation on a digital input signal, and the sample-and-hold operation is driven by a clock signal. The level determining section is configured to output a held sample at a first level when a level of the digital input signal is constant between sampling points, and output the held sample at a second level when the level of the digital input signal changes between sampling points.

Even when noise signals each having a different level from the input signal and a width shorter than a sampling cycle are successively mixed with the input signal, which has a constant level at successive sampling points, the noise signals can be removed by using the above-described filter circuits or the signal processing circuit.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE EXEMPLARY EMBODIMENTS

Figure 1:
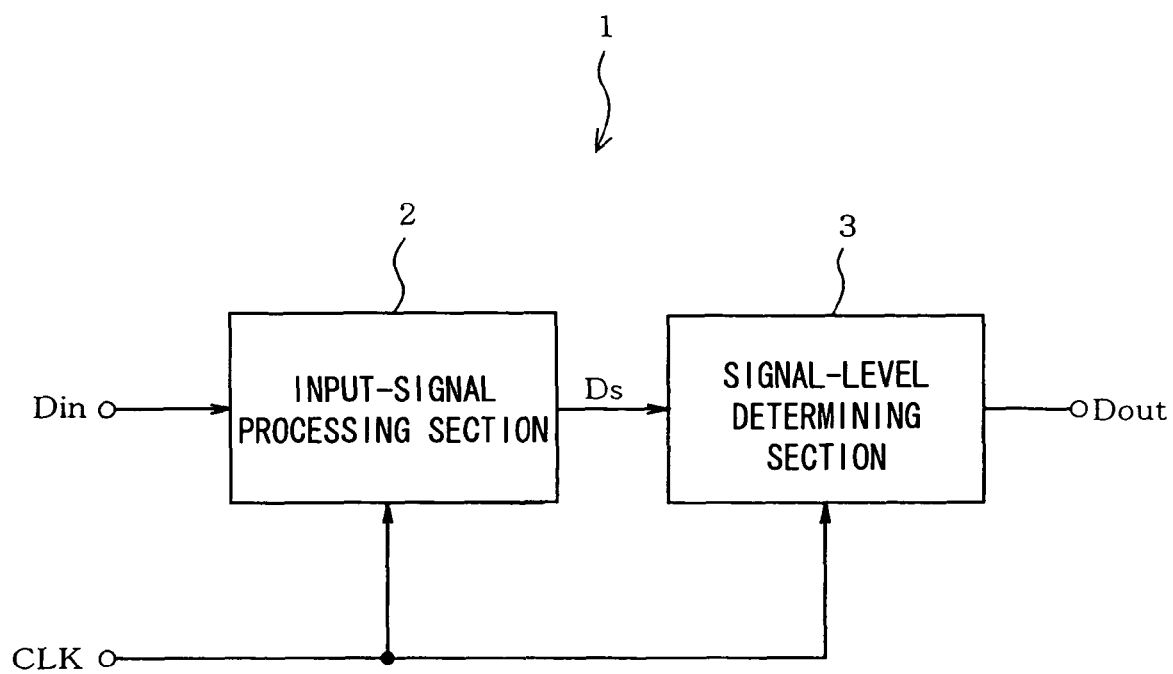
FIG. 1 is a block diagram illustrating an exemplary filter circuit according to an embodiment.

A filter circuit 1 according to an embodiment of the invention will now be described with reference to FIG. 1. The filter circuit 1 can be used for removing noise from a digital input signal $D_{in}$. The digital input signal $D_{in}$ is a binary signal such as an output signal of a rotation-speed detecting sensor for detecting a rotation speed of a wheel or a rotation number of an engine in a transmission, and a communication signal in a communication system. The filter circuit 1 includes a complimentary metal-oxide semiconductor (CMOS) element and functions as an integrated circuit (IC) of a bipolar CMOS (BiCMOS) process with an analog circuit (not shown) including a bipolar element.

The filter circuit 1 includes an input-signal processing section 2 and a signal-level determining section 3 that are operated concurrently with a clock signal CLK. The input-signal processing section 2 conducts a sample-and-hold operation on the digital input signal $D_{in}$ at a sampling point such as a rising edge of the clock signal CLK. When a level of the digital signals $D_{in}$ changes between adjacent sampling points, such as during a sampling cycle, the holding signal is reversed. The holding signal is then output as a sampling input signal $D_s$.

The signal-level determining section 3 sequentially delays the sampling input signal $D_s$ in plural stages at the rising edges of the clock signal CLK. When the delayed signals in all the stages are at a first level, such as at the H level, an output signal $D_{out}$ at the H level is output. When the delayed signals in all the stages are at a second level, such as the L level, the output signal $D_{out}$ at the L level is output.

Figure 2:
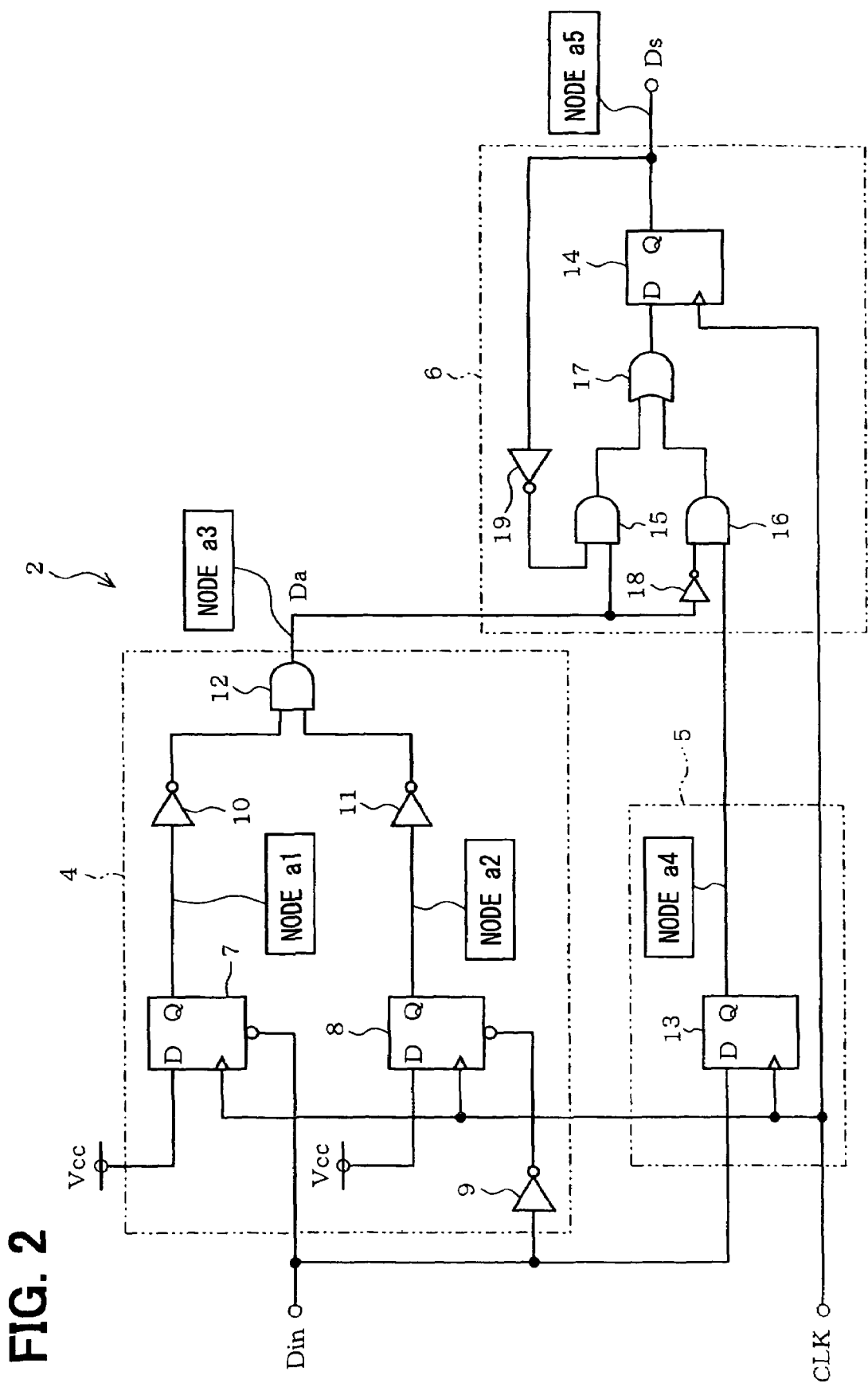
FIG. 2 is a block diagram illustrating an input-signal processing section.

As shown in FIG. 2, the input-signal processing section 2 includes a level-change detecting portion 4, a sampling portion 5, and an information-adding portion 6. The level-change detecting portion 4 is provided for detecting a change of the digital input signal $D_{in}$ between adjacent sampling points. The level-change detecting portion 4 includes D flip-flop circuits 7 and 8. Each of the D flip-flop circuits 7 and 8 has a data terminal, a reset terminal that is reset at the L level, and an output terminal.

The D flip-flop circuit 7 detects a level change of the digital input signal $D_{in}$ from the H level to the L level between adjacent sampling points. In the D flip-flop circuit 7, the data terminal is supplied with a voltage $V_{cc}$ corresponding to the H level, and the reset terminal receives the digital input signal $D_{in}$.

The D flip-flop circuit 8 is provided for detecting a level change of the digital input signal $D_{in}$ from the L level to the H level between adjacent sampling points. In the D flip-flop circuit 8, the data terminal is supplied with a voltage $V_{cc}$, and the reset terminal receives a reversed signal of the digital input signal $D_{in}$ through a NOT gate 9.

A node $a_1$ located at the output terminal of the D flip-flop circuit 7, is connected with an AND gate 12 through a NOT gate 10. A node $a_2$ located at the output terminal of the D flip-flop circuit 8 is connected with the AND gate 12 through a NOT gate 11.

The AND gate 12 outputs a level-change detecting signal $D_a$ through a node $a_3$ located at an output terminal of the AND gate 12. When the level of the digital input signal $D_{in}$ has changed since the last sampling point, the level-change detecting signal $D_a$ transitions to the H level. When the level of the digital input signal $D_{in}$ hasn't changed since the last sampling point, the level-change detecting signal $D_a$ remains at the L level.

The sampling portion 5 includes a D flip-flop circuit 13 that samples and holds the digital input signal $D_{in}$ at the rising edge of the clock signal CLK. The D flip-flop circuit 13 has a node $a_4$ located at an output terminal. The information-adding portion 6 includes a D flip-flop circuit 14. When the level-change detecting signal $D_a$ from the level-change detecting portion 4 is at the L level, the D flip-flop circuit 14 holds the digital input signal $D_{in}$ from the sampling portion 5. In contrast, when the level-change detecting signal $D_a$ from the level-change detecting portion 4 is at the H level, the D flip-flop circuit 14 reverses the signal held therein and holds the reversed signal.

That is, the information-adding portion 6 selects either the output signal from the sampling portion 5 or the reversed version of the signal held therein, in accordance with the level-change detecting signal $D_a$ from the level-change detecting portion 4. Thus, the input-signal processing section 2 outputs the sampling input signal $D_s$ having level-change information of the digital input signal $D_{in}$.

The above-described alternative process in accordance with the level-change detecting signal $D_a$ is performed with AND gates 15 and 16, an OR gate 17, and NOT gates 18 and 19. The AND gate 15 receives the level-change detecting signal $D_a$ and an output signal of the D flip-flop circuit 14 that is reversed at the NOT gate 19. The AND gate 16 receives the level-change detecting signal $D_a$ that is reversed at the NOT gate 18 and the digital input signal $D_{in}$ from the sampling circuit 5. Output signals from the AND gates 15 and 16 are input into a data terminal of the D flip-flop circuit 14 through the OR gate 17. The D flip-flop circuit 14 outputs the sampling input signal $D_s$ from a node $a_5$ located at an output terminal.

Figure 3:
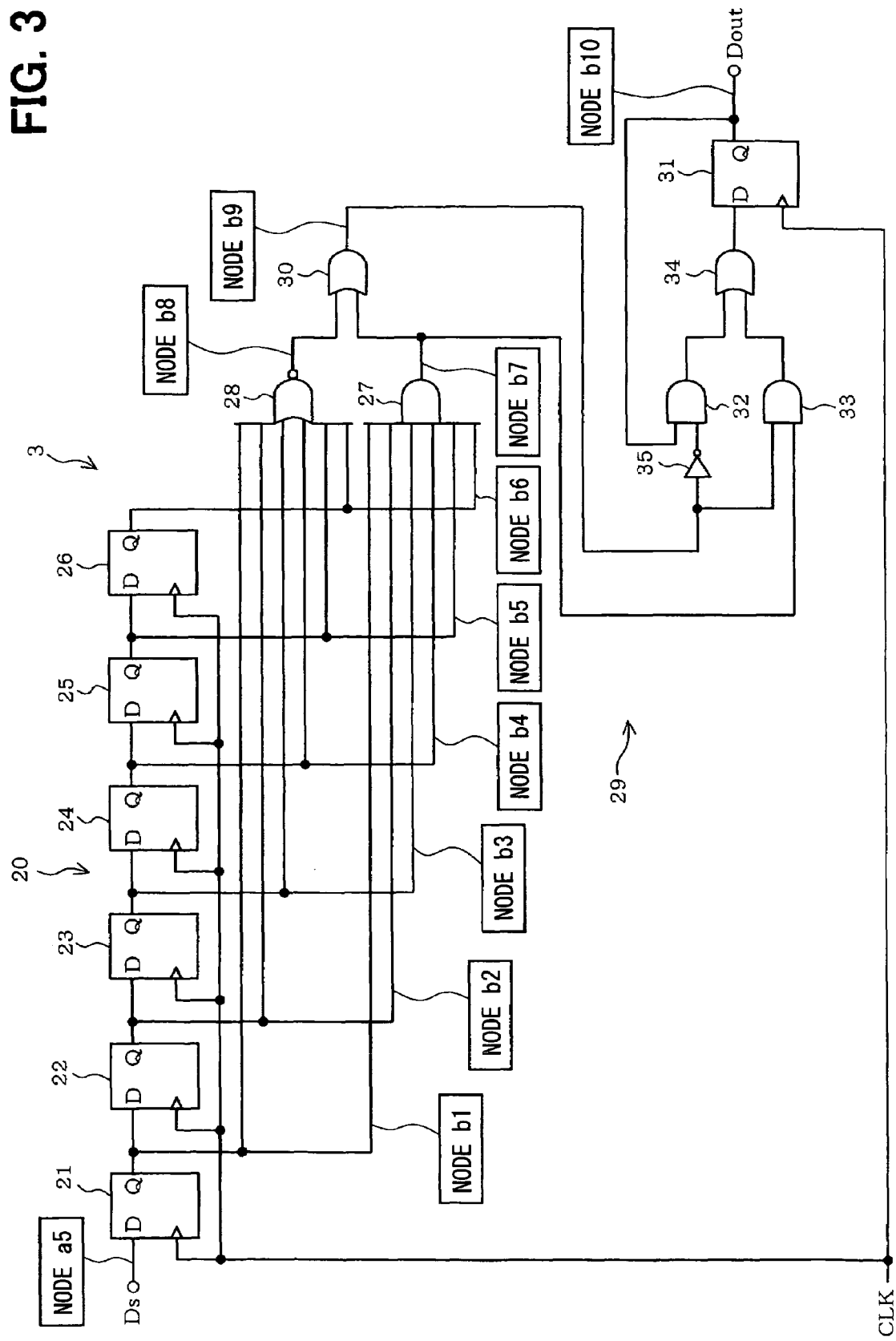
FIG. 3 is a block diagram illustrating a signal-level determining section.

As shown in FIG. 3, the signal-level determining section 3 includes six D flip-flop circuits 21-26, an AND gate 27, and a NOR gate 28. The D flip-flop circuits 21-26 are connected in series to provide a delay portion 20. The delay portion 20 sequentially delays the sampling input signal $D_s$ from the input-signal processing section 2 by the sampling cycle, which is at or proportional to the period or cycle of the clock signal CLK, and transmits the delayed signals. The AND gate 27 and the NOR gate 28 receive the delayed signals from the D flip-flop circuits 21-26. When all the delayed signals are at the H level, the AND gate 27 outputs a signal at the H level. When all the delayed signals are at the L level, the NOR gate 28 outputs a signal at the H level.

The signal-level determining section 3 further includes an RS flip-flop circuit 29. The RS flip-flop circuit 29 includes OR gates 30 and 34, a D flip-flop circuit 31, AND gates 32 and 33, and a NOT gate 35. The OR gate 30 receives the output signals of the AND gate 27 and the NOR gate 28. When an output signal of the OR gate 30 is at the L level, the D flip-flop circuit 31 maintains a signal held therein without change.

When the output signal of the OR gate 30 is at the H level, the D flip-flop circuit 31 holds the output signal of the AND gate 27.

The above-described alternative process in accordance with the output signal of the OR gate 30 is performed with the AND gates 32 and 33, the OR gate 34, and the NOT gate 35. The AND gate 32 receives the output signal of the OR gate 30 that is reversed at the NOT gate 35 and the output signal of the D flip-flop circuit 31. The AND gate 33 receives the output signal of the OR gate 30 and the output signal of the AND gate 27. Output signals of the AND gates 32 and 33 are sent to a data terminal of the D flip-flop circuit 31 through the OR gate 34. The D flip-flop circuit 31 outputs a filtered output signal $D_{out}$ from a node $b_{10}$ located at an output terminal. Output terminals of the D flip-flop circuits 21-26 are expressed as nodes $b_1$-$b_6$, respectively. Output terminals of the AND gate 27, the NOR gate 28, and the OR gate 30 are expressed as a node $b_7$, a node $b_8$, and a node $b_9$, respectively.

An operation of the filter circuit 1 will now be described with reference to FIGS. 4-12. A signal of the node $a_1$ transitions to the L level when the digital input signal $D_{in}$ has changed from the H level to the L level since the last sampling point even just one time and transitions to the H level when digital input signal $D_{in}$ has never changed from the H level to the L level since the last sampling point. A signal of the node $a_2$ transitions to the L level when the digital input signal $D_{in}$ has changed from the L level to the H level since the last sampling point even just one time and transitions to the H level when digital input signal $D_{in}$ has never changed from the L level to the H level since the last sampling point. Thus, the level-change detecting signal $D_a$ of the node $a_3$ transitions to the H level when the level of the digital input signal $D_{in}$ has changed since the last sampling point even just one time and remains at the L level when the level of the digital input signal $D_{in}$ has never changed since the last sampling point.

When the level-change detecting signal $D_a$ is at the L level, the digital input signal $D_{in}$ held by the sampling portion 5 is held by the D flip-flop circuit 14 at the next sampling point, i.e., the rising edge of the clock signal CLK. When the level-change detecting signal $D_a$ is at the H level, the signal held by the D flip-flop circuit 14 is reversed and the reversed signal is held by the D flip-flop circuit 14. The sampling input signal $D_s$ of the node $a_5$ is the output signal of the D flip-flop circuit 14.

Figure 4:
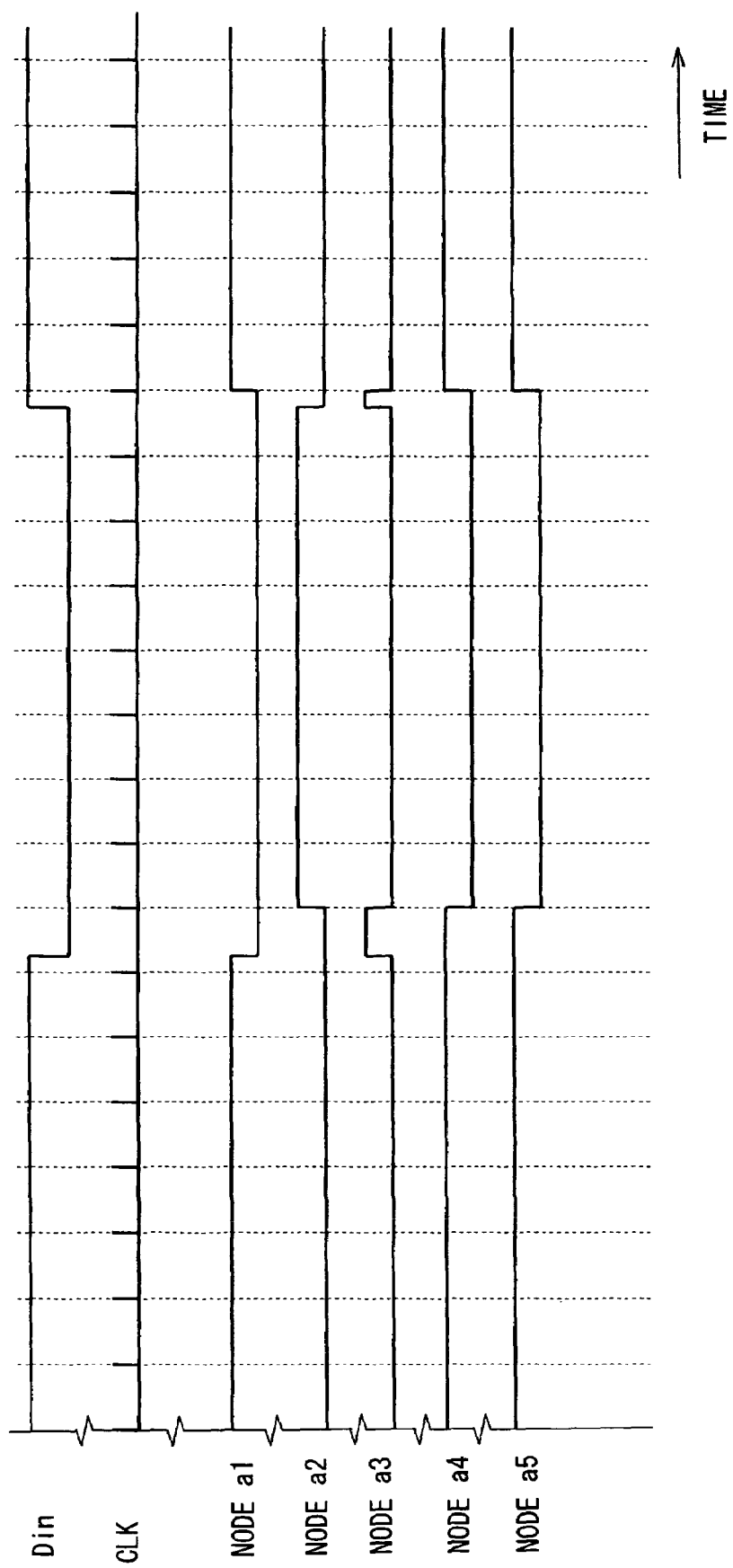
FIG. 4 is a timing chart illustrating the input-signal processing section of FIG. 2 in a case where noise signals are not mixed with a digital input signal.
Figure 5:
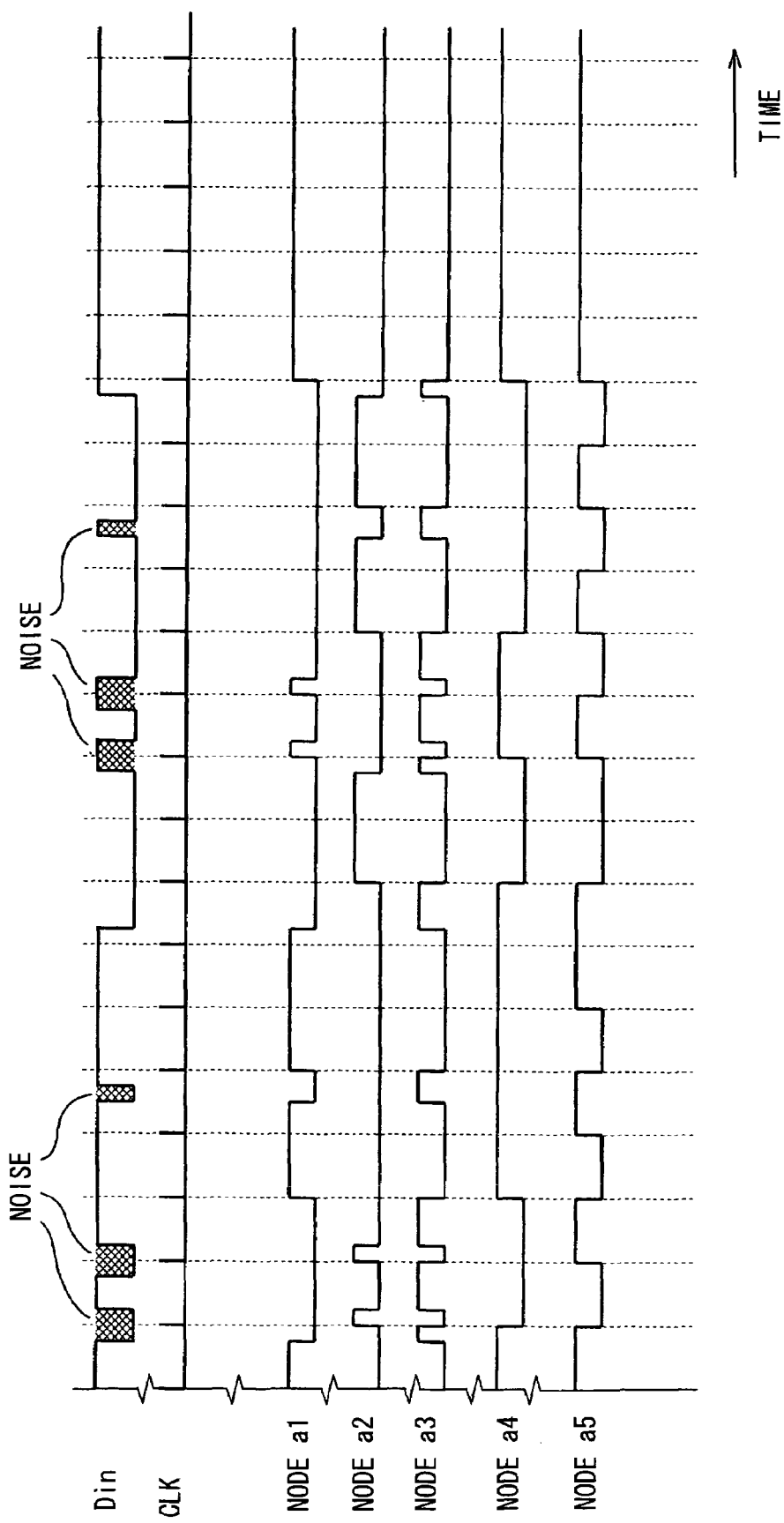
FIG. 5 is a timing chart illustrating the signal-level determining section of FIG. 3 in a case where noise signals each having a width shorter than a sampling cycle are mixed with a digital input signal.

In a case where a noise signal is not mixed with the digital input signal $D_{in}$ as shown in FIG. 4, when the level of the digital input signal $D_{in}$ changes, the sampling input signal $D_s$ of the node $a_5$ transitions to the same level as the digital input signal $D_{in}$ at the next sampling point. In contrast, in a case where noise signals each having a width shorter than the sampling cycle are mixed with the digital input signal $D_{in}$ as shown in FIG. 5, the sampling input signal $D_s$ of the node $a_5$ is reversed at the next sampling point every time where noise signal is mixed with the input signal. Additionally, when the level of the digital input signal $D_{in}$ hasn't changed in a sampling cycle, the sampling input signal $D_s$ transitions to the same level as the digital input signal $D_{in}$ at a time when the sampling cycle ends.

In the signal-level determining section 3, the signal of the node $b_7$ transitions to the H level when all the signals of the nodes $a_5$ and $b_1$-$b_6$ are at the L level, and the signal of the node $b_8$ transitions to the H level when all the signals of the nodes $a_5$ and $b_1$-$b_6$ are at the H level. Thus, in a case where all the signals of the nodes $b_1$-$b_6$ are at the L level or all the signals of the nodes $b_1$ to $b_6$ are at the H level, a signal is determined as a normal signal and a noise-determining signal of the node $b_9$ transitions to the H level. In the other case, the signal is determined as a noise signal and the noise-determining signal of the node $b_9$ transitions to the L level.

Figure 6:
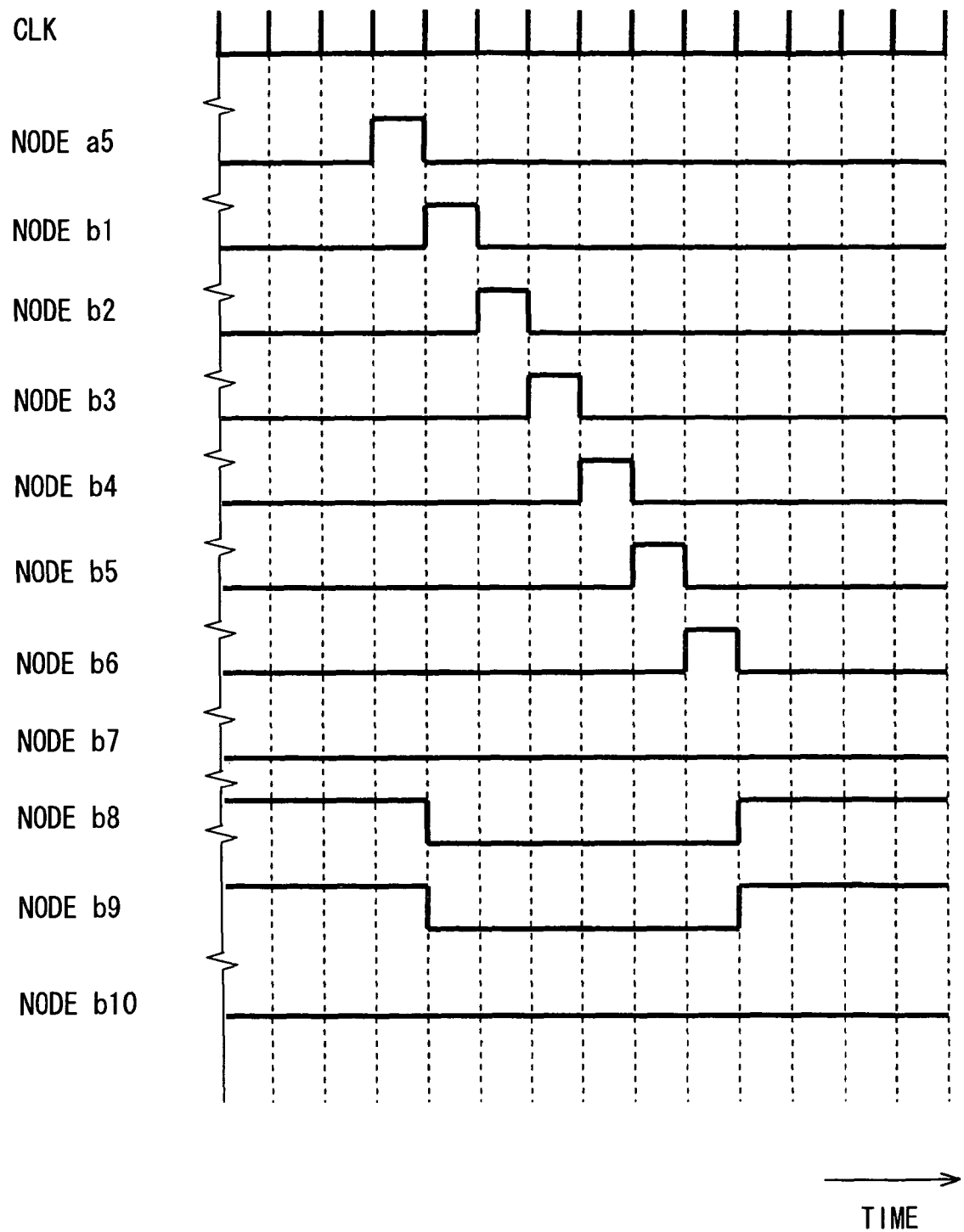
FIG. 6 is a timing chart illustrating the signal-level determining section of FIG. 3 in a case where a noise signal having a width shorter than a sampling cycle is mixed with a digital input signal.

As shown in FIG. 6, in a case where a noise signal having a width equal to or shorter than the sampling cycle is mixed with the digital input signal $D_{in}$, the sampling input signal $D_s$ of the node $a_5$ transitions to the H level only for a sampling cycle. The signal at the H level is transmitted to the nodes $b_1$-$b_6$ of the D flip-flop circuits 21-26 in order while being delayed by the sampling cycle. The signals of the nodes $b_7$-$b_9$ become the L level for six sampling cycles, that is, until the signal at the H level passes through the delay portion 20. When the signal of the node $b_9$ is at the L level, the output signal $D_{out}$ of the node $b_{10}$ remains at the L level.

Figure 7:
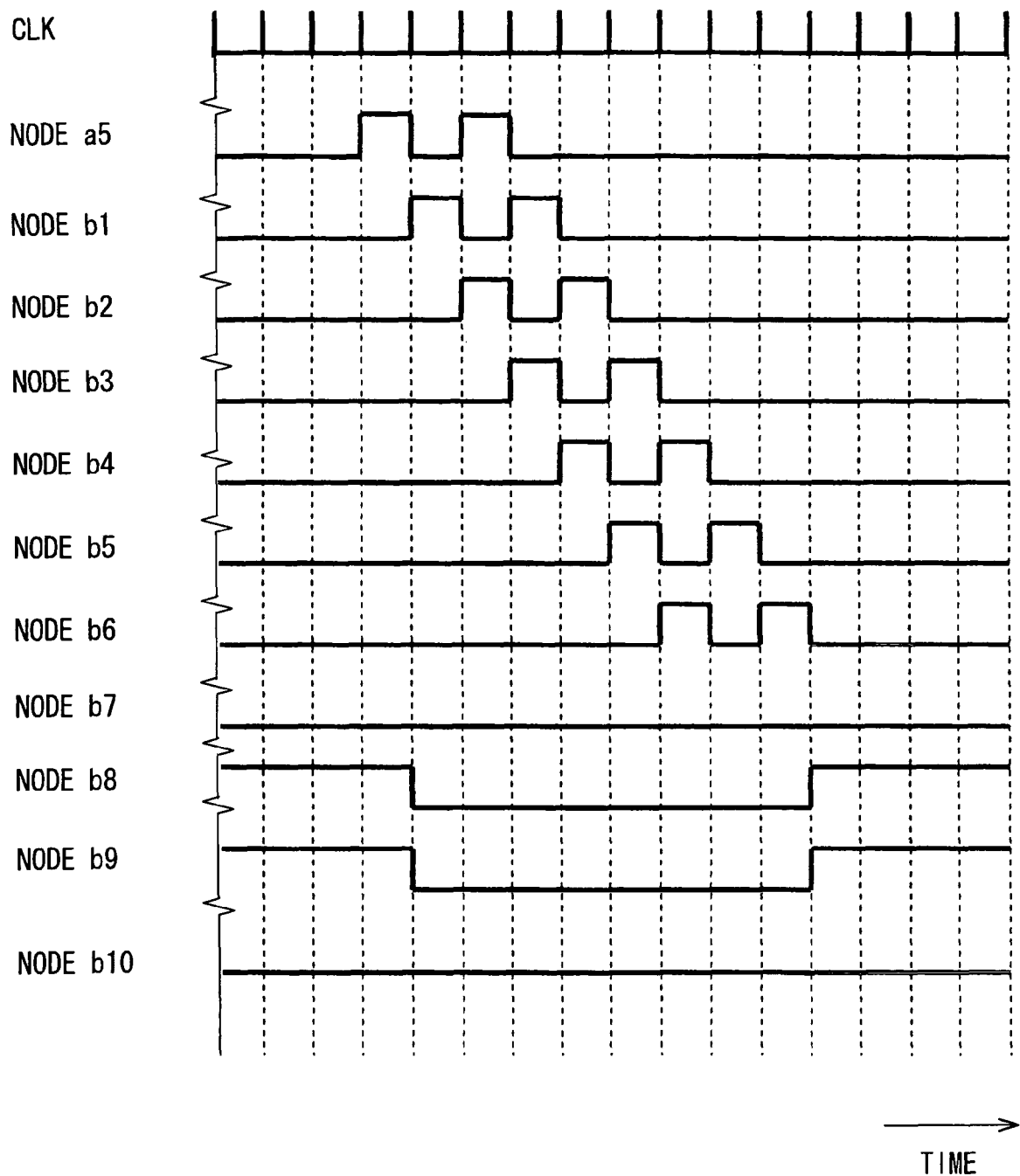
FIG. 7 is a timing chart illustrating the signal-level determining section of FIG. 3 in a case where two noise signals each having a width shorter than a sampling cycle are successively mixed with a digital input signal.

In an example shown in FIG. 7, two noise signals at the H level each having a width shorter than the sampling cycle are mixed with the digital input signal $D_{in}$ at the L level. As shown in FIG. 5, the sampling input signal $D_s$ is reversed every time a noise signal is mixed with the input signal, even when noise signals at the same level are mixed with the input signal at successive sampling points. The sampling input signal $D_s$, which is reversed repeatedly, is transmitted in the delay portion 20.

Thus, when the noise signals each having a width shorter than the sampling cycle are successively mixed with the digital input signal $D_{in}$, the signals of the nodes $b_7$-$b_9$ remain at the L level until six sampling cycles have passed since the noise signal disappeared and until the level of the sampling signal $D_s$ becomes constant.

Also in a case where noise signals are successively mixed with the digital input signal $D_{in}$ more than three times, the level of the sampling input signal Ds is reversed repeatedly. Thus, the filter circuit 1 is prevented from mistaking the narrow-width noise signals that are successively mixed with the digital input signal $D_{in}$ for a normal signal and does not output the signal $D_{out}$ at the H level, which is the same level as the noise signals.

Figure 8:
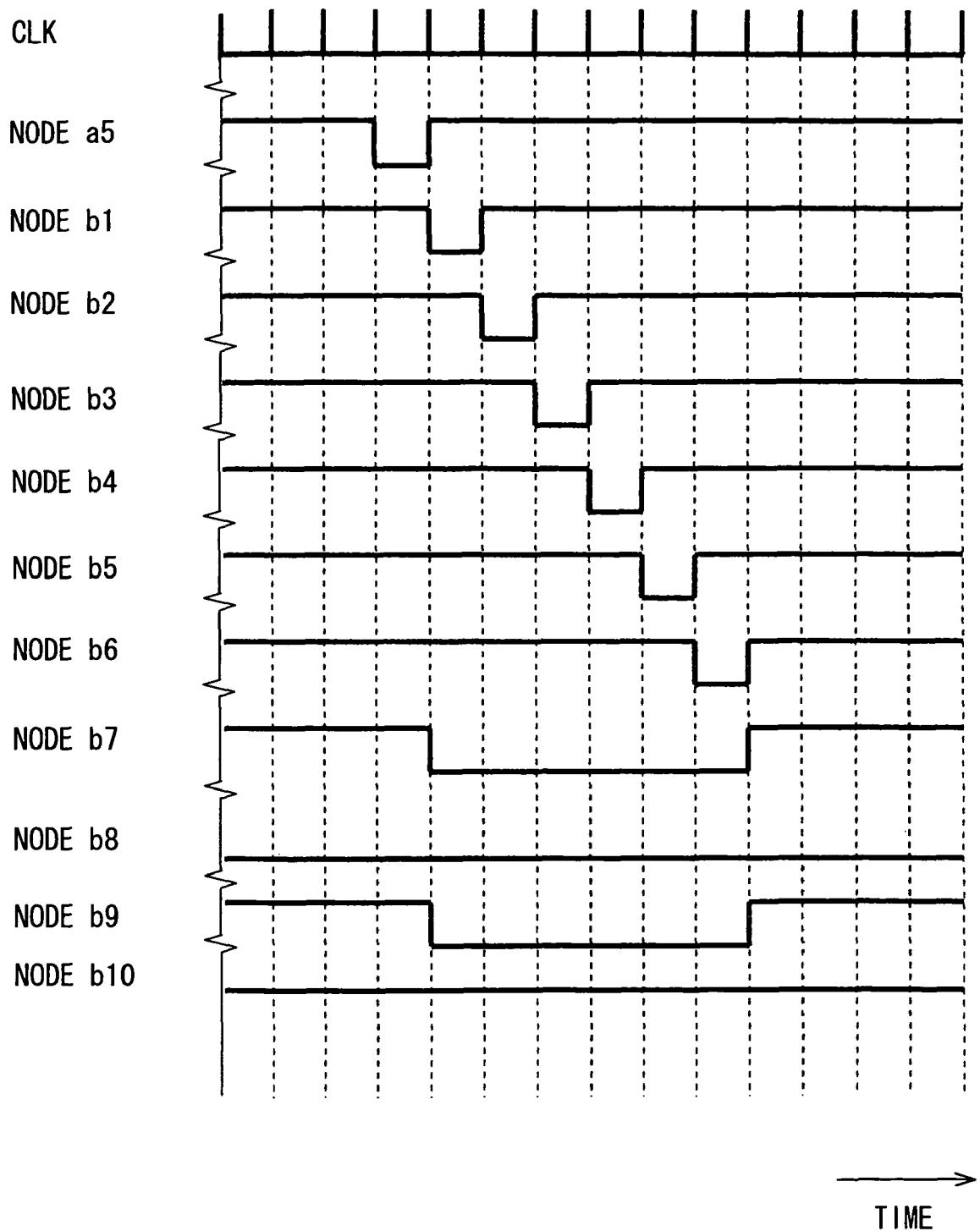
FIG. 8 is a timing chart illustrating the signal-level determining section of FIG. 3 in a case where a noise signal having a width shorter than a sampling cycle is mixed with a digital input signal.
Figure 9:
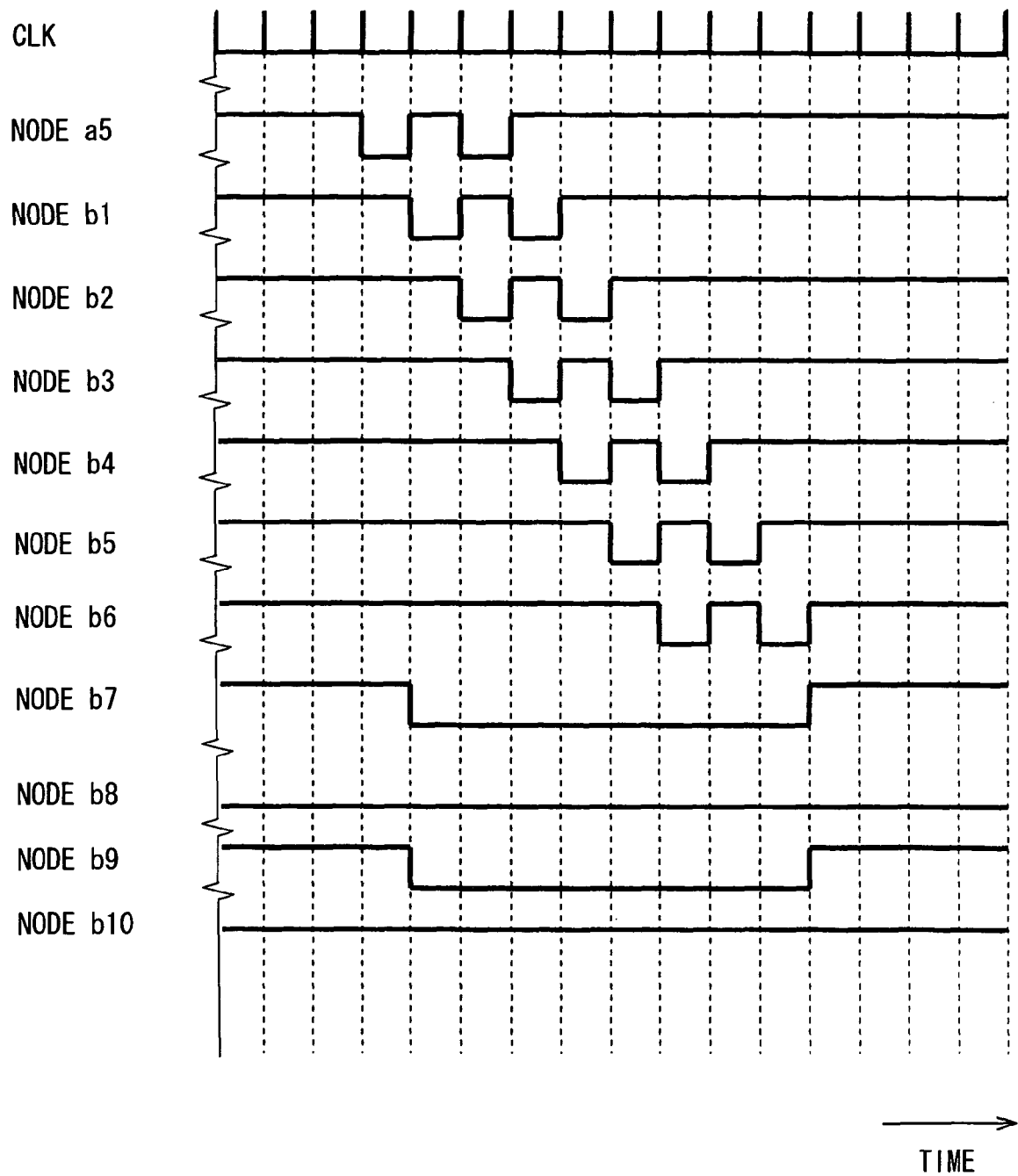
FIG. 9 is a timing chart illustrating the signal-level determining section of FIG. 3 in a case where two noise signals each having a width shorter than a sampling cycle are successively mixed with a digital input signal.

When a noise signal having a width shorter than sampling cycle is mixed with the digital input signal $D_{in}$ at the H level as shown in FIG. 8, the signals of the nodes $a_5$ and $b_1$-$b_{10}$ change in a manner similar to those shown in FIG. 6. When two noise signals each having a width shorter than the sampling cycle are mixed with the digital input signal $D_{in}$ at the H level as shown in FIG. 9, the signals of the nodes $a_5$ and $b_1$-$b_{10}$ change in a manner similar to those shown in FIG. 7.

Figure 10:
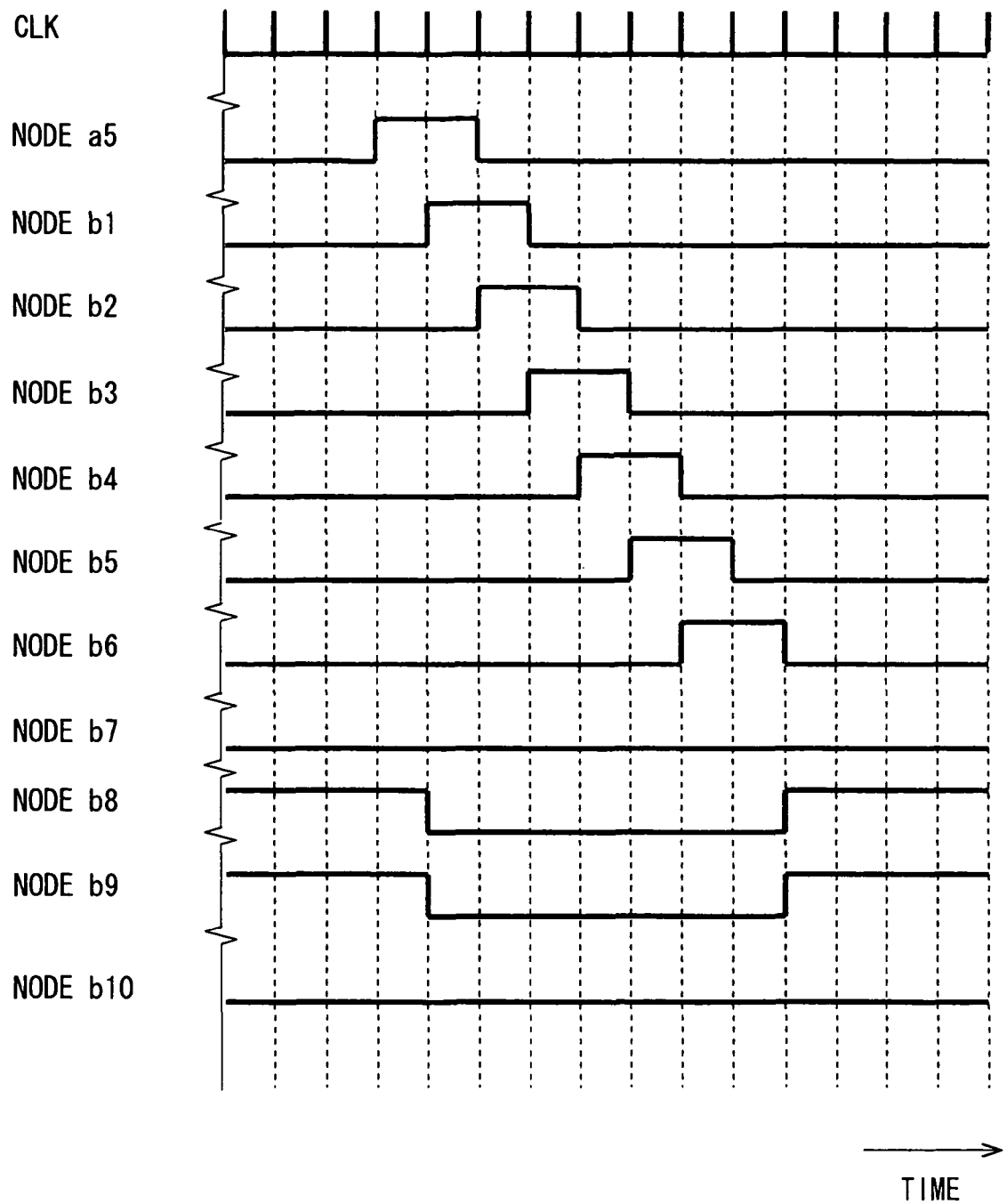
FIG. 10 is a timing chart illustrating the signal-level determining section of FIG. 3 in a case where a noise signal having a width of two sampling cycles is mixed with a digital input signal.
Figure 11:
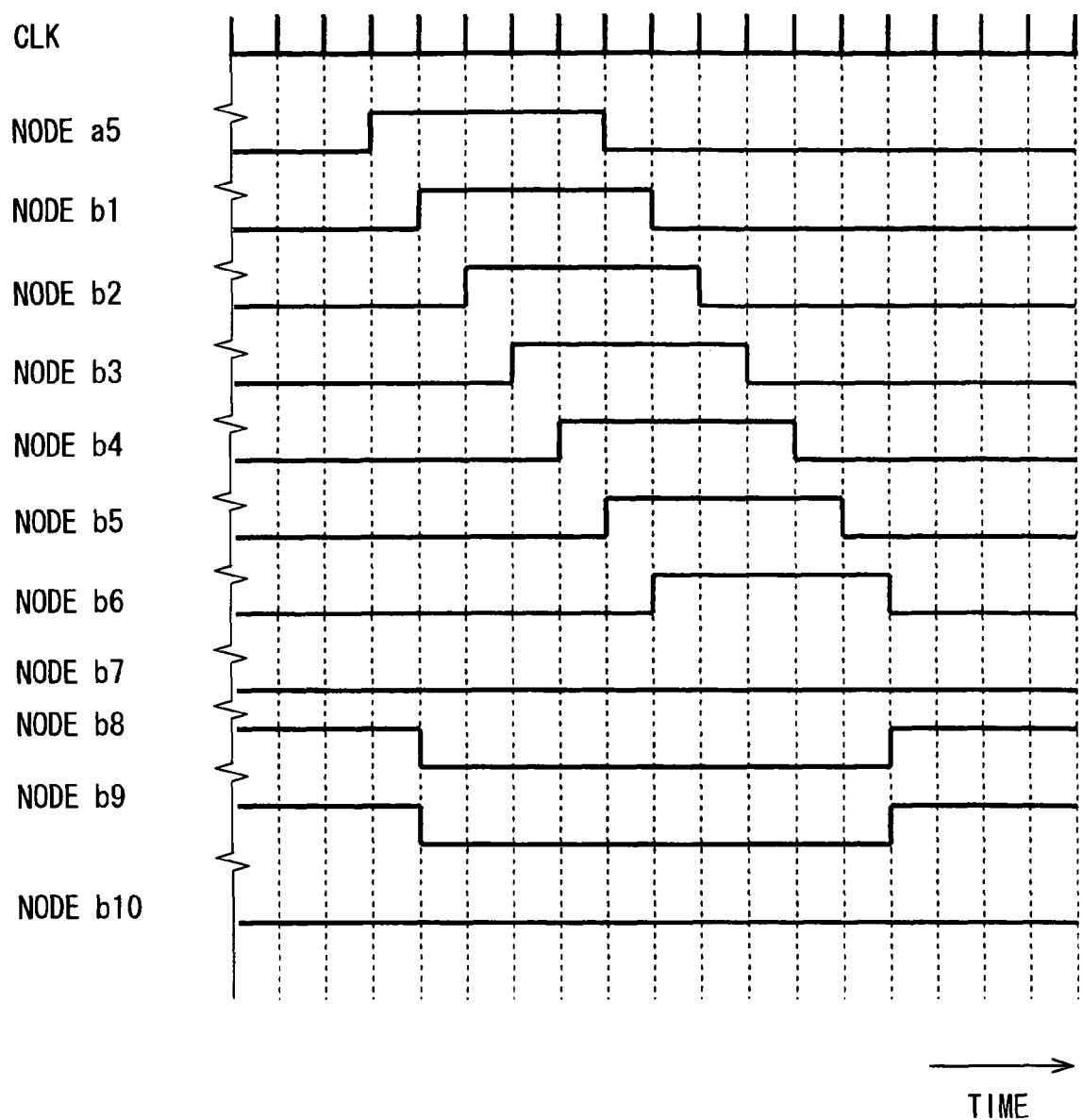
FIG. 11 is a timing chart illustrating the signal-level determining section of FIG. 3 in a case where a noise signal having a width of five sampling cycles is mixed with a digital input signal.

When a noise signal that keeps a constant level for a period longer than the sampling cycle is mixed with the digital input signal $D_{in}$, the sampling input signal $D_s$ is not reversed unlike the case where the noise signals each having a width shorter than the sampling cycle are successively mixed with the digital input signal $D_{in}$. For example, as shown in FIG. 10-FIG. 12, when a noise signal that keeps the H level for two sampling cycles, five sampling cycles, or six sampling cycles is mixed with the digital input signal $D_{in}$, the sampling input signal $D_s$ is not reversed and remains at the H level, which is the same level as the noise signal.

Figure 12:
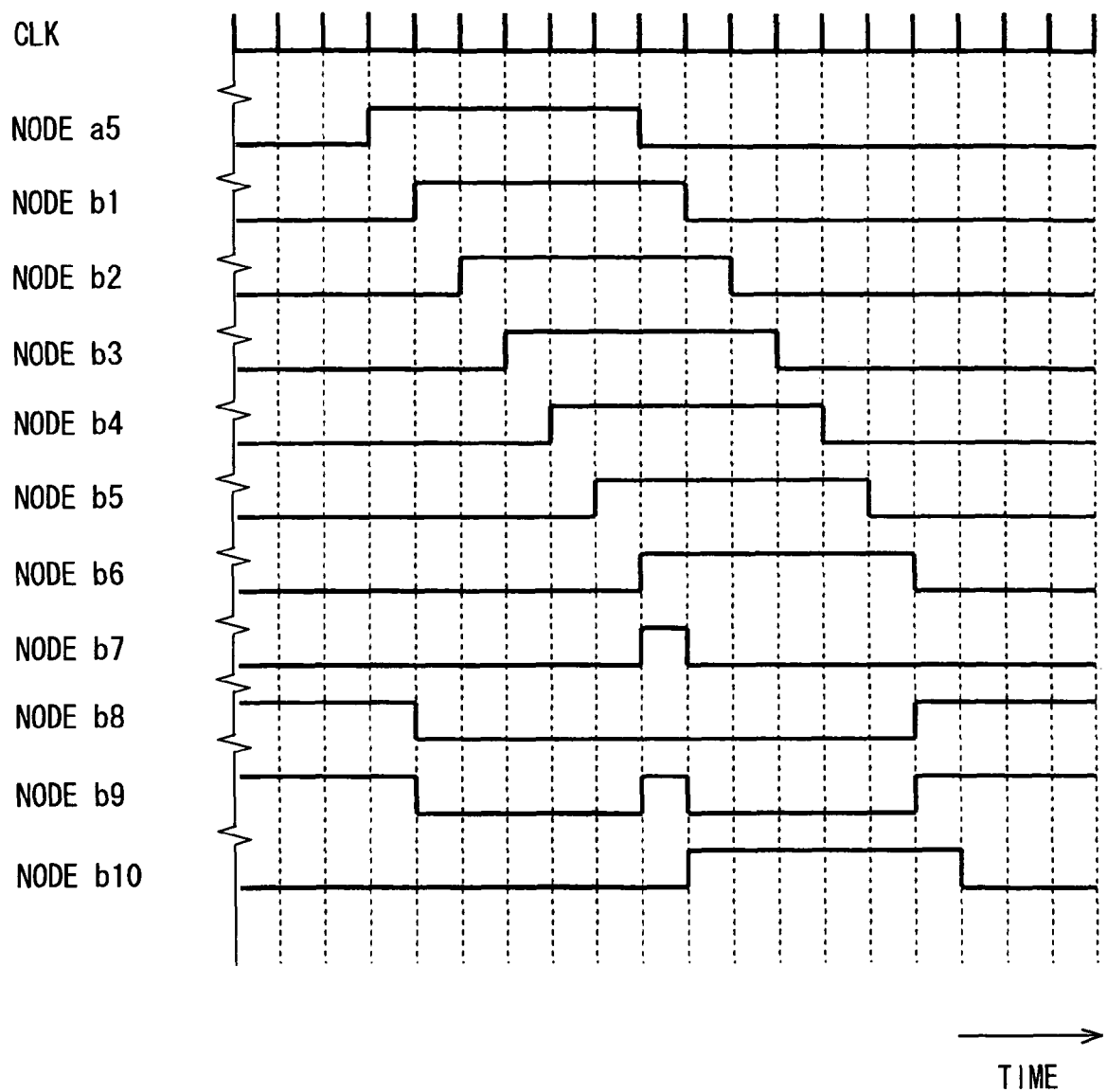
FIG. 12 is a timing chart illustrating the signal-level determining section of FIG. 3 in a case where a noise signal having a width of six sampling cycles is mixed with a digital input signal.

Thus, as shown in FIG. 12, when a noise signal having a width equal to or more than six sampling cycles is mixed with the digital input signal $D_{in}$, all the signals of the D flip-flop circuits 21-26 in the delay portion 20 transition to the H level, and thereby the output signal $D_{out}$ transitions to the H level, which is the same level as the noise signal.

As described above, the filter circuit 1 includes the input-signal processing section 2 in front of the signal-level determining section 3. The input-signal processing section 2 samples and holds the digital input signal $D_{in}$ when the input-signal processing section 2 receives the clock signal CLK. When the level of the digital input signal $D_{in}$ changes between the sampling points, the input-signal processing section 2 reverses the sampling input signal $D_s$. Thus, the input-signal processing section 2 detects the level change of the digital input signal $D_{in}$ between the sampling points. When the level change is detected, the input-signal processing section 2 forcibly reverses the sampling input signal $D_s$.

Thus, even when noise signals each having a different level from the digital input signal $D_{in}$ and a width shorter than the sampling signal are successively mixed with the digital input signal $D_{in}$ at plural sampling points, the input-signal processing section 2 outputs the sampling input signal $D_s$ that is reversed by the input-signal processing section 2 at the sampling cycle. When the sampling input signal $D_s$ is reversed, the signal of the node $b_9$ is prevented from being at the H level. As a result, the filter circuit 1 does not output a narrow width noise signal mixed with the digital input signal $D_{in}$ as a normal signal and can remove the narrow width noise with a high degree of certainty. Additionally, the input-signal processing section 2 can be configured as a small logic circuit as shown in FIG. 2, and thereby limiting an undesirable increase in chip area.

The input-signal processing section 2 can remove a noise signal that keeps a constant level for a period longer than the sampling cycle as long as the period is shorter than six sampling cycles. A noise signal of longer than six sampling cycles can be effectively handled by increasing the number of serial connections of the D flip-flop circuits of the delay portion 20 in the signal-level determining section 3. Alternatively, the timing cycle of the clock signal CLK, such as the sampling cycle, can be lengthened. For example, when a clock frequency is 1 μs, a noise signal having a width about in a range from 0 to 6 μs can be removed. When the clock frequency is 2 μs, a noise signal having a width about in a range from 0 to 12 μs can be removed.

Although the present invention has been fully described, for example, in connection with the above described exemplary embodiments, including a preferred embodiment thereof, with reference to the accompanying drawings, it is to be noted that various changes and modifications will become apparent to those skilled in the art.

For example, the filter circuit 1 can be used, not only for an IC for a vehicle, but also for various ICs that are required to be controlled with a high degree of accuracy, and that are required to reduce malfunctions caused by noise. Alternatively, the filter circuit 1 can be used for various circuits such as those that are required to mask a pulse, because the filter circuit 1 can remove a noise signal having a width shorter than a predetermined width.

What is claimed is:

1. A filter circuit comprising:
   an input-signal processing section that samples and holds a digital input signal input according to a clock signal, outputs the holding signal as a sampling input signal when a level of the digital input signal is constant between sampling points, and reverses the holding signal and outputs the reversed signal as the sampling input signal when the level of the digital input signal changes between the sampling points; and
   a signal-level determining section that sequentially delays the sampling input signal from the input-signal processing section into plural stages, outputs a first level signal at a first level when all the delayed signals are at the first level, and outputs a second level signal at a second level when all the delayed signals are at the second level.

2. The filter circuit according to claim 1, wherein the input-signal processing section includes:
   a sampling portion for sampling the digital input signal concurrently with the clock signal and holding the sampled signal;
   a level-change detecting portion for detecting a level change of the digital input signal between the sampling points; and
   an information-adding portion that holds the sampled signal held by the sampling portion when the level-change detecting portion detects no level change of the digital input signal and outputs the holding signal as the sampling input signal, and reverses a level of the signal held by the information-adding portion, holds the reversed signal, and outputs the reversed signal as the sampling input signal when the level-change detecting portion detects the level change of the digital input signal.

3. The filter circuit according to claim 2, wherein the level-change detecting portion includes:
   a first part for detecting the level change of the digital input signal from the first level to the second level; and
   a second part for detecting the level change of the digital input signal from the second level to the first level.

4. A filter circuit comprising:
   an input-signal processing section configured to:
      output a sample of a digital input signal at a first sampled level, the digital input signal sampled according to a clock signal, the sample output at the first sampled level when a level of the digital input signal is constant between sampling points, and
      output the sample at a reversed sample level when the level of the digital input signal changes between the sampling points; and
   a signal-level determining section that outputs a sample signal at a first level when all of one or more delayed versions of the sample are at the first level, and outputs a signal at a second level when all of the one or more delayed versions of the sample are at the second level.

5. The filter circuit according to claim 4, wherein the signal-level determining section further includes one or more delay elements, the signal-level determining section configured to sequentially delay the output sample in the one or more delay elements to generate the one or more delayed versions.

6. The filter circuit according to claim 5, wherein the one or more delay elements include one or more D-type flip flop element connected in series.

7. The filter circuit according to claim 4, wherein the input-signal processing section includes:
   a sample-and-hold portion for sampling the digital input signal in accordance with a clock signal and for holding the sampled signal as the sample;
   a level-change detecting portion for detecting when the level of the digital input signal changes between the sampling points; and
   an information-adding portion configured to:
      assign the first level to the sample help by the sample-and-hold section and outputs the first level as a sampled signal when the level-change detecting portion detects no level change of the digital input signal; and
      assign the second level to the sample, the second level reversed from the first level, and outputs the second level as the sampled signal when the level-change detecting portion detects the level change of the digital input signal.

8. The filter circuit according to claim 7, wherein the level-change detecting portion includes:
   a first part for detecting the level change of the digital input signal from the first level to the second level; and
   a second part for detecting the level change of the digital input signal from the second level to the first level.

* * * * *